US012640722B2

(12) United States Patent
Sakamoto

(10) Patent No.: US 12,640,722 B2
(45) Date of Patent: May 26, 2026

(54) SEMICONDUCTOR CIRCUIT DEVICE, INTEGRATED CIRCUIT DEVICE, AND INSPECTION METHOD

(71) Applicant: SEIKO EPSON CORPORATION, Tokyo (JP)

(72) Inventor: Yoshifumi Sakamoto, Chino (JP)

(73) Assignee: SEIKO EPSON CORPORATION (JP)

( * ) Notice: Subject to any disclaimer, the term of this patent is extended or adjusted under 35 U.S.C. 154(b) by 201 days.

(21) Appl. No.: 18/768,395

(22) Filed: Jul. 10, 2024

(65) Prior Publication Data

US 2025/0023561 A1 Jan. 16, 2025

(30) Foreign Application Priority Data

Jul. 11, 2023 (JP) ................................. 2023-113635

(51) Int. Cl.
*H03K 17/081* (2006.01)

(52) U.S. Cl.
CPC .............................. *H03K 17/08104* (2013.01)

(58) Field of Classification Search
CPC .. H03K 17/687; H03K 17/567; H03K 17/063; H03K 2217/0081; H03K 17/102; H03K 17/08122; H03K 17/08104; H03K 17/06; H03K 2217/0027; H03K 17/08; H03K 3/00; H03K 3/356113; H03K 17/0412; H03K 17/0814; H03K 19/0944; H03K 19/0013; H03K 19/017; H03K 17/223; G01R 31/2621; G01R 31/2623; G01R 31/12; G01R 31/3835; G01R 31/52; G01R 19/0084; G01R 31/26; G01R 31/2639; G01R 31/54; G01R 31/28; G01R 31/3161

See application file for complete search history.

(56) References Cited

U.S. PATENT DOCUMENTS

| | | | | |
|---|---|---|---|---|
| 6,642,120 | B2 * | 11/2003 | Terashima | ....... H03K 3/356113 |
| | | | | 257/376 |
| 11,710,734 | B2 * | 7/2023 | Kono | ..................... H10D 62/53 |
| | | | | 257/272 |
| 11,799,468 | B2 * | 10/2023 | Yoshimura | ............. H02H 9/041 |

FOREIGN PATENT DOCUMENTS

| | | |
|---|---|---|
| JP | 2005-101218 A | 4/2005 |
| JP | 2006-513585 A | 4/2006 |
| WO | 2004-059734 A1 | 7/2004 |

* cited by examiner

*Primary Examiner* — Vinh P Nguyen
(74) *Attorney, Agent, or Firm* — Harness, Dickey & Pierce, P.L.C.

(57) ABSTRACT

A semiconductor circuit device includes a driver circuit, a pre-driver circuit, a first pad, first wiring, a second pad, second wiring, and a voltage clamp circuit. The driver circuit includes a high-side first transistor. The pre-driver circuit includes a first pre-driver that drives a gate of the first transistor. The first wiring couples the first pad to a source of the first transistor. The second wiring couples the second pad to a power supply node of the first pre-driver. The voltage clamp circuit clamps a voltage between power supplies of the first pre-driver.

13 Claims, 10 Drawing Sheets

SEMICONDUCTOR CIRCUIT DEVICE, INTEGRATED CIRCUIT DEVICE, AND INSPECTION METHOD

The present application is based on, and claims priority from JP Application Serial Number 2023-113635, filed Jul. 11, 2023, the disclosure of which is hereby incorporated by reference herein in its entirety.

BACKGROUND

1. Technical Field

The present disclosure relates to a semiconductor circuit device, an integrated circuit device, and an inspection method.

2. Related Art

A metal-oxide-semiconductor field effect transistor (MOSFET) used for a power device or the like is known. JP-T-2006-513585 discloses a method in which a pad coupled to a gate of a MOSFET and a pad coupled to an electrostatic discharge (ESD) protection circuit are separated from each other and can be inspected individually.

The gate of the MOSFET may be driven by a pre-driver, and the pre-driver may be protected by a voltage clamp circuit. Even in such a case, a method of suitably performing a screening test for a breakdown voltage between the gate and the source of the MOSFET is required.

SUMMARY

According to an aspect of the present disclosure, a semiconductor circuit device includes a driver circuit including a high-side first transistor, a pre-driver circuit including a first pre-driver that drives a gate of the first transistor, a first pad, first wiring coupling the first pad to a source of the first transistor, a second pad, second wiring coupling the second pad to a power supply node of the first pre-driver, and a voltage clamp circuit that clamps a voltage between power supplies of the first pre-driver.

According to an aspect of the present disclosure, an integrated circuit device includes the semiconductor circuit device and a package housing the semiconductor circuit device. A power supply terminal of the package is electrically coupled to the first pad and the second pad.

According to another aspect of the present disclosure, a method of inspecting a semiconductor circuit device including a driver circuit including a high-side first transistor, a pre-driver circuit including a first pre-driver that drives a gate of the first transistor, a first pad, first wiring coupling the first pad to a source of the first transistor, a second pad, second wiring coupling the second pad to a power supply node of the first pre-driver, and a voltage clamp circuit that clamps a voltage between power supplies of the first pre-driver includes setting the source of the first transistor to a first inspection voltage by applying the first inspection voltage to the first pad, setting the gate of the first transistor to a second inspection voltage different from the first inspection voltage by applying the second inspection voltage to the second pad, and performing a screening test for a breakdown voltage between the gate and the source of the first transistor by measuring a current flowing in the first pad.

BRIEF DESCRIPTION OF THE DRAWINGS

FIG. 2 is a diagram for explaining a screening test of a first transistor.

FIG. 3 is a diagram illustrating an example of a half-bridge circuit according to the embodiment.

DESCRIPTION OF EMBODIMENTS

Hereinafter, preferred embodiments of the present disclosure will be described in detail. The present embodiment described below does not unduly limit the contents described in the appended claims, and all of configurations described in the present embodiment are not necessarily essential configuration requirements.

Figure 1:
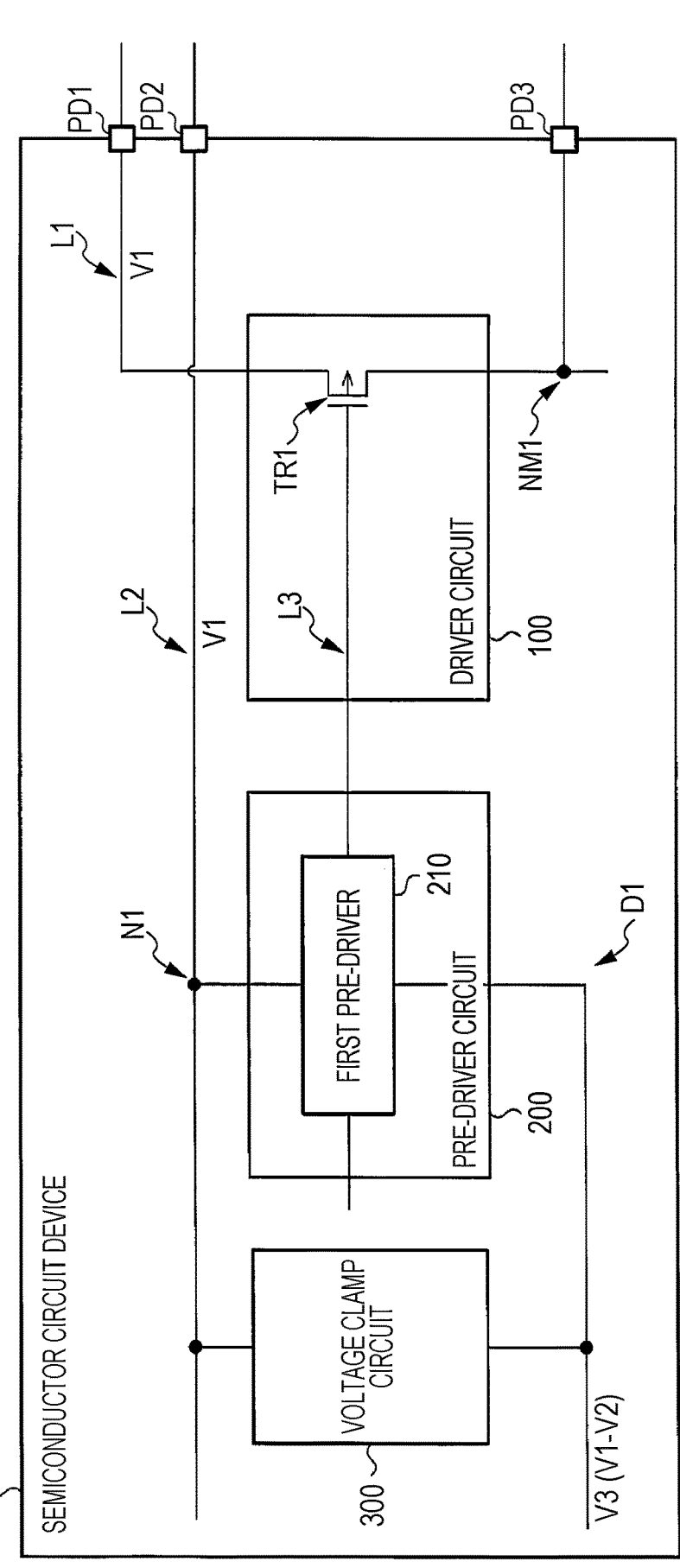
FIG. 1 is a diagram illustrating an example of a configuration of a semiconductor circuit device according to an embodiment.

FIG. 1 illustrates an example of a configuration of a semiconductor circuit device 10 according to the present embodiment. In the following description, a case where an external load M (described later) serves as a motor and the semiconductor circuit device 10 functions as a motor control device may be exemplified. However, for example, the external load M may serve as an LED and the semiconductor circuit device 10 may function as an LED control device. The use of the semiconductor circuit device 10 is not particularly limited. Hereinafter, an operation of the semiconductor circuit device 10 to drive the external load M will be referred to as a normal operation.

For example, a plurality of semiconductor circuit devices 10 are formed on a predetermined substrate having a predetermined shape by a wafer process. The substrate including the semiconductor circuit device 10 formed in this manner is referred to as a semiconductor wafer. The predetermined shape is, for example, a circular shape, but may be another shape such as a square. The predetermined substrate is, for example, a single crystal silicon substrate, but may be a sapphire substrate, a glass substrate, or the like. The wafer process refers to a method of forming a device by a patterning method in which photolithography, chemical vapor deposition (CVD), sputtering, etching, and the like are combined. Then, the formed semiconductor wafer is subjected to a wafer level test process to determine whether or not the semiconductor circuit device 10 formed in the semiconductor wafer is a non-defective product. The wafer level test process is specifically, for example, a probe inspection process, but may include other stress tests and the like. For example, the probe inspection process is to set the semiconductor wafer including the semiconductor circuit device 10 on an inspection device (not illustrated), bring tips of probe needles arranged in a predetermined pattern into contact with pads of the semiconductor circuit device 10, and apply a voltage to each of the pads according to a predetermined inspection program. As a result, an IC chip including a semiconductor circuit device 10 that does not satisfy a predetermined criterion is determined as a defective product that is highly likely to cause an operation failure in a period shorter than a target period. Then, information on whether each IC chip included in the semiconductor wafer is a non-defective product or a defective product is recorded, and after the semiconductor wafer is singulated into individual IC chips through a subsequent dicing process or the like, only an IC chip determined to be a non-defective product is selected based on the information recorded in the wafer level test process. Thus, it is possible to screen out an IC chip determined to be a defective product.

Thereafter, the singulated IC chips are accommodated in a package 3 (described later) by an assembly process and modularized as an integrated circuit device 1. That is, the package 3 refers to each component excluding the IC chips from the integrated circuit device 1. The package 3 is a dual in-line package (DIP), a quad flat package (QFP), or the like, but may be a ball grid array (BGA) or the like. The form of the package 3 is appropriately determined at the time of designing the integrated circuit device 1. Accordingly, each component of the package 3 and details of the assembly process are appropriately determined. For example, when the package 3 is a DIP or a QFP, the package 3 includes, for example, a lead frame, a bonding wire, a molded resin, a die bonding material, and the like, and the assembly process includes a wire bonding process, a resin sealing process, and the like. Although FIG. 1 illustrates the single semiconductor circuit device 10, each IC chip may include a plurality of semiconductor circuit devices 10, and may further include a circuit device other than the semiconductor circuit device 10. The integrated circuit device 1 may be a multi-chip package including an IC chip other than an IC chip including the semiconductor circuit device 10.

The semiconductor circuit device 10 includes a driver circuit 100, a pre-driver circuit 200, a pad PD1 as a first pad, first wiring L1, a pad PD2 as a second pad, second wiring L2, and a voltage clamp circuit 300. That is, the pad PD1 illustrated in FIG. 1 corresponds to the first pad related to a method described in the present embodiment, and the pad PD2 illustrated in FIG. 1 corresponds to the second pad related to the method described in the present embodiment. In the normal operation, a first voltage V1 is supplied from a first power supply device (not illustrated) to the pad PD1 and the pad PD2. The first voltage V1 is a high-potential-side power supply voltage higher than a low-potential-side power supply voltage such as a ground voltage.

The driver circuit 100 controls the external load M not illustrated in FIG. 1. The driver circuit 100 includes a first transistor TR1. The first transistor TR1 illustrated in FIG. 1 is a P-type transistor, more specifically, a P-type MOSFET. The source of the first transistor TR1 is coupled to the pad PD1 via the first wiring L1. The drain of the first transistor TR1 is coupled to a node NM1. The node NM1 is coupled to the external load M (not illustrated) via a pad PD3. That is, the driver circuit 100 illustrated in FIG. 1 includes the high-side first transistor TR1. When the semiconductor circuit device 10 functions as a motor control device, the first transistor TR1 can be implemented by, for example, a transistor having a double-diffused metal oxide semiconductor (DMOS) structure. For example, when the first transistor TR1 is turned on, a voltage of 42 V as the first voltage V1 is supplied to the external load M via the pad PD3.

In order to make the description easy to understand, the first voltage V1 will be described below as a voltage of 42 V, but this is merely an example, and the value of the first voltage V1 is not limited. The same applies to a second voltage V2, a third voltage V3, a fourth voltage V4, a first inspection voltage TV1, a second inspection voltage TV2, and the like, which will be described later.

The probe inspection process to be performed on the semiconductor circuit device 10 includes a process of inspecting whether or not a gate oxide film included in the first transistor TR1 is appropriately formed. The gate oxide film being appropriately formed means, for example, that the thickness of the formed gate oxide film is within a target range in design, and that the formed gate oxide film does not include a fatal defect. In the inspection, for example, a voltage higher than a first breakdown voltage which is a breakdown voltage of the first transistor TR1 is applied between the source and the gate of the first transistor TR1 for a short time, and a generated leakage current is measured. When a first transistor TR1 in which a measured leakage current is higher than a predetermined reference value is present, a semiconductor circuit device 10 including the first transistor TR1 is determined to be a defective product, and an IC chip including the semiconductor circuit device 10 is excluded from the assembly process. When the first transistor TR1 is, for example, a P-type transistor having a DMOS structure, the first breakdown voltage is approximately in a range from 5.5 V to 6 V.

By performing the above-described inspection, a defective product caused by forming a defective gate oxide film included in a first transistor TR1 is screened out. That is, the probe inspection process to be performed on the first transistor TR1 or the like can also be referred to as a screening test between the gate and the source of the first transistor TR1 or the like. Hereinafter, a screening test for the breakdown voltage between the gate and the source of the first transistor TR1 or the like may be merely referred to as a breakdown voltage screening test of the first transistor TR1 or the like.

The pre-driver circuit 200 includes a first pre-driver 210. The first pre-driver 210 drives the first transistor TR1 based on a control signal from a control circuit not illustrated. The first pre-driver 210 drives the gate of the first transistor TR1. The second wiring L2 couples the pad PD2 to a node N1 which is a power supply node of the first pre-driver 210. The control circuit (not illustrated) includes, for example, a logic circuit including a transistor having a complementary metal oxide semiconductor (CMOS) structure and operates at a voltage of, for example, approximately 1.8 V to 3.3 V. In this manner, the control circuit can control the driver circuit 100 via the pre-driver circuit 200. Therefore, the external load M such as a motor can be driven and controlled.

The first pre-driver 210 includes an inverter circuit in which, for example, a P-type transistor and an N-type transistor are coupled in series to each other. Each of the transistors included in the inverter circuit has, for example, a CMOS structure. Therefore, the semiconductor circuit device 10 can be made small in size. Since each of the transistors included in the inverter circuit has, for example, a CMOS structure, when a breakdown voltage of each of the transistors included in the first pre-driver 210 is a second breakdown voltage, the second breakdown voltage is approximately 5 V that is lower than the above-described first breakdown voltage.

One end of the first pre-driver 210 is coupled to the node N1. The second wiring L2 couples the node N1 to the pad PD2. The third voltage V3 is supplied to a power supply line indicated by D1. The third voltage V3 is higher than the low-potential-side power supply voltage and lower than the first voltage V1. For example, the third voltage V3 obtained by subtracting the second voltage V2 from the first voltage V1 is supplied by a regulator (not illustrated) to the power supply line indicated by D1 based on the first voltage V1 and the second voltage V2, which will be described later. To be more specific, when the first voltage V1 is 42 V as described above and the second voltage V2 is 5 V, the third voltage V3 is 37 V. That is, the node N1 is a high-potential-side power supply node of the first pre-driver 210. The second voltage V2 is supplied from a second power supply device (not illustrated) via a pad PD4 (not illustrated in FIG. 1).

Since a power supply line for 42 V is coupled to the power supply line for 37 V, the first pre-driver 210 can cause the transistors included in the first pre-driver 210 to operate at a voltage equal to or lower than the second breakdown voltage (5V). A control signal from the control circuit (not illustrated) is converted into a voltage of 42 V or 37 V through a level shifter (not illustrated) and is input to the first pre-driver 210. Accordingly, in the normal operation, the first pre-driver 210 outputs the voltage of 42 V as a high-level voltage and outputs the voltage of 37 V as a low-level voltage. When the voltage of 37 V is output as a low-level voltage from the first pre-driver 210, the voltage of 42 V that is the first voltage V1 is already supplied to the source of the first transistor TR1, a voltage of 5 V is applied between the source and the gate of the first transistor TR1 that is a P-type transistor as described above, and the first transistor TR1 is turned on.

Since the driver circuit 100 and the pre-driver circuit 200 are configured in the above-described manner, the third voltage V3 (5 V) as a fixed voltage is applied between the source and the gate of the first transistor TR1 being turned on, regardless of the magnitude of the voltage applied to the pads PD1 and PD2. In other words, even when the value of the first voltage V1 is set to be equal to or higher than 42 V or lower than 42 V, the voltage applied between the source and the gate of the first transistor TR1 being turned on is the third voltage V3 (5 V) as a fixed value.

Figure 2:
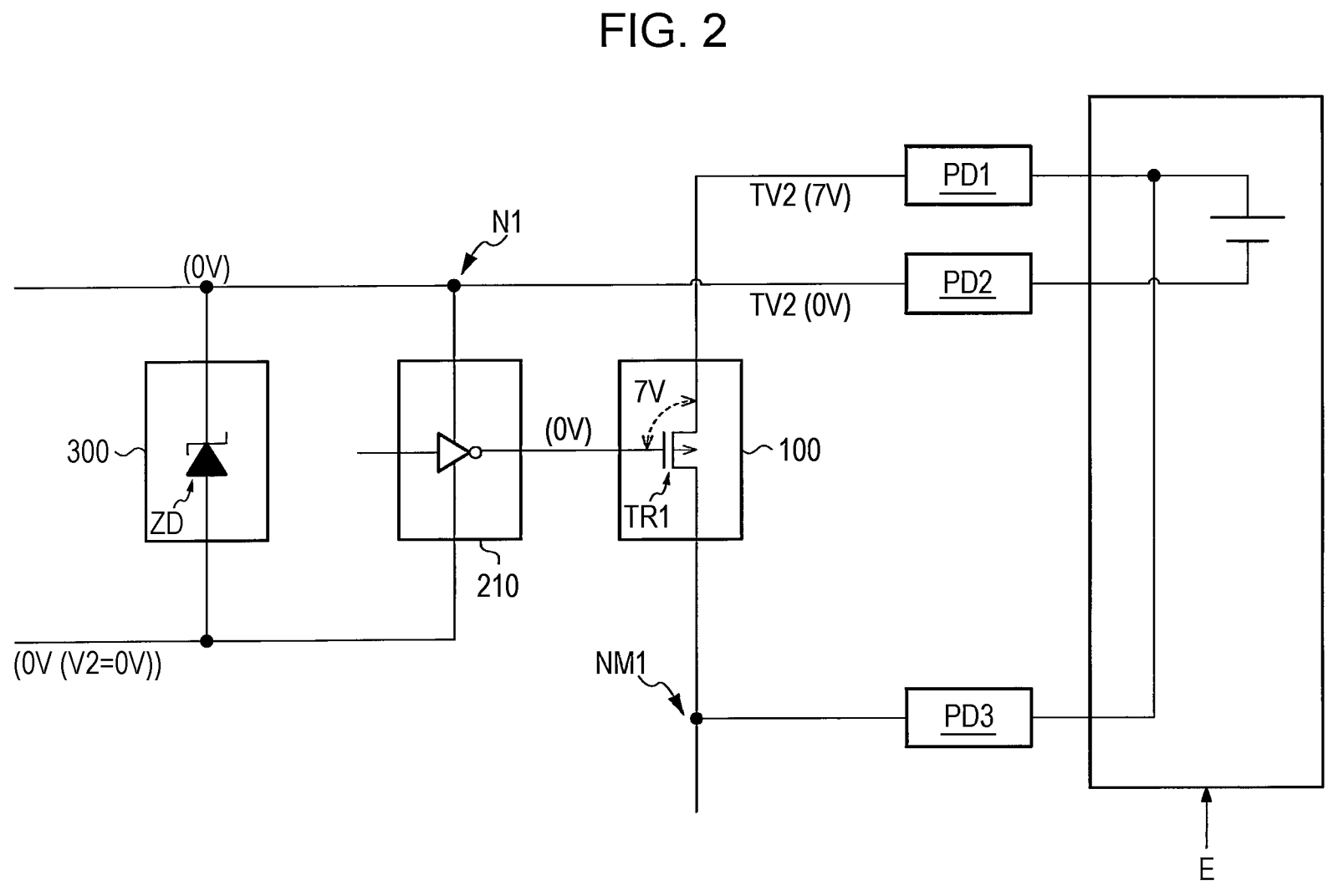

The voltage clamp circuit 300 clamps a voltage between the power supplies of the first pre-driver 210. That is, the voltage clamp circuit 300 suppresses damage to the first pre-driver 210 due to a surge voltage such as static electricity. The voltage clamp circuit 300 includes, for example, a Zener diode ZD illustrated in FIG. 2 and the like. A breakdown voltage of the Zener diode ZD is approximately 5.7 V. Although FIG. 2 illustrates the single Zener diode ZD in the voltage clamp circuit 300, the voltage clamp circuit 300 may include, for example, two Zener diodes ZD coupled in series and in opposite directions, or may further include a resistor. Thus, the surge voltage can be clamped to a desired voltage, regardless of whether the surge voltage is positive or negative.

Next, an inspection method for the breakdown voltage screening test of the first transistor TR1 in the semiconductor circuit device 10 according to the present embodiment is described. In the inspection method according to the present embodiment, the first inspection voltage TV1 is applied to the pad PD1. As a result, the source of the first transistor TR1 is set to the first inspection voltage TV1. In addition, the second inspection voltage TV2 is applied to the pad PD2. The value of the second inspection voltage TV2 is different from the value of the first inspection voltage TV1. The value of the second inspection voltage TV2 may be 0 V. In the following description, in consideration of the first breakdown voltage of approximately 5.5 V to 6 V as described above, the first inspection voltage TV1 is exemplified as 7 V, and the second inspection voltage TV2 is exemplified as 0 V.

Specifically, for example, in FIG. 2, the first inspection voltage TV1 (7 V) is supplied to the pad PD1 and the pad PD3 from the inspection device indicated by E, and the second inspection voltage TV2 (0 V) is supplied to the pad PD2 from the inspection device indicated by E. Although not illustrated in FIG. 2, the second inspection voltage TV2 (0 V) is supplied to the pad PD4 from the inspection device. Therefore, voltages at the power supply nodes coupled to the first pre-driver 210 are 0 V. In the following drawings, the inspection device is not illustrated.

The voltage of 0 V is output as a low-level voltage from the first pre-driver 210, and the gate of the first transistor TR1 is set to 0 V that is the second inspection voltage TV2. As a result, since the source of the first transistor TR1 coupled to the pad PD1 is set to the first inspection voltage TV1 (7 V), the voltage of 7 V is applied between the gate and the source of the first transistor TR1. Thus, when a leakage current flows from the source of the first transistor TR1 toward the gate of the first transistor TR1, the value of a current flowing in the pad PD1 increases. Therefore, it is possible to perform the breakdown voltage screening test of the first transistor TR1 by measuring the value of the current flowing in the pad PD1.

Since the first inspection voltage TV1 (7 V) is applied between the gate and the source of the first transistor TR1, the first transistor TR1 is turned on. In this case, since the first inspection voltage TV1 (7 V) is supplied to the pad PD3 as described above, the voltage at the node NM1 coupled to the drain of the first transistor TR1 is 7 V and there is no difference in potential between the source and the drain of the first transistor TR1. Therefore, when the first transistor TR1 has the DMOS structure, it is possible to suppress flow of an excessive current between the source and the drain of the first transistor TR1 when the screening test of the first transistor TR1 is performed.

As described above, the semiconductor circuit device 10 according to the present embodiment includes the driver circuit 100, the pre-driver circuit 200, the first pad (pad PD1), the first wiring L1, the second pad (pad PD2), the second wiring L2, and the voltage clamp circuit 300. The driver circuit 100 includes the high-side first transistor TR1. The pre-driver circuit 200 includes the first pre-driver 210 that drives the gate of the first transistor TR1. The first wiring L1 couples the first pad (pad PD1) to the source of the first transistor TR1. The second wiring L2 couples the second pad (pad PD2) to the power supply node of the first pre-driver 210. The voltage clamp circuit 300 clamps a voltage between the power supplies of the first pre-driver 210.

Since the semiconductor circuit device 10 according to the present embodiment includes the driver circuit 100 and the pre-driver circuit 200 as described above, the semiconductor circuit device 10 can control the driver circuit 100 that cannot be directly controlled by the control circuit (not illustrated). Thus, for example, the semiconductor circuit device 10 can be used for a power device or the like. Therefore, the semiconductor circuit device 10 can be more widely used. Since the semiconductor circuit device 10 according to the present embodiment further includes the voltage clamp circuit 300, the semiconductor circuit device 10 can protect the first pre-driver 210.

In the semiconductor circuit device 10 including the driver circuit 100, the pre-driver circuit 200, and the voltage clamp circuit 300, the breakdown voltage screening test of the first transistor TR1 may not be appropriately performed in a wafer level test process. As described above, the semiconductor circuit device 10 may be configured such that only a fixed voltage is applied between the gate and the source of the first transistor TR1 regardless of the value of the first voltage V1 in the normal operation. In this case, in the screening test of the first transistor TR1, even when a voltage higher than the first breakdown voltage is applied to the pad coupled to the external terminal from which the first voltage V1 is supplied, only a voltage equal to or lower than the first breakdown voltage is applied between the gate and the source of the first transistor TR1. In addition, in this case, since the turning on and off of the first transistor TR1 is controlled by the control of the pre-driver circuit 200, it is not possible to perform the breakdown voltage screening test of the first transistor TR1 by simply providing the pad coupled to the gate of the first transistor TR1 in a similar manner to the method described in JP-T-2006-513585.

However, in the semiconductor circuit device 10 according to the present embodiment, the first wiring L1 couples the first pad (pad PD1) to the source of the first transistor TR1, and the second wiring L2 couples the second pad (pad PD2) to the power supply node (node N1) of the first pre-driver 210. Thus, the voltage output from the first pre-driver 210 to the gate of the first transistor TR1 can be different from the voltage supplied to the gate of the first transistor TR1. Therefore, when the same voltage is supplied to the first wiring L1 and the second wiring L2, the difference between the voltage at the source of the first transistor TR1 and the voltage at the gate of the first transistor TR1 can be set to a desired value. Therefore, it is possible to perform the breakdown voltage screening test of the first transistor TR1.

In addition, as described above, since the voltage (7 V), which is higher than 5.7 V that is the breakdown voltage of the Zener diode ZD, can be applied to the first transistor TR1, it is possible to perform the breakdown voltage screening test of the first transistor TR1 by applying a desired voltage. In addition, for example, even when the first pad PD1 and the second pad PD2 are treated as a single pad, the first inspection voltage TV1 is 5.5 V, the second inspection voltage TV2 is 0 V, and a voltage of 0 V is output as a low-level voltage from the first pre-driver 210, it is possible to perform the breakdown voltage screening test of the first transistor TR1. In this case, the voltage of 5.5 V, which is the first inspection voltage TV1, is applied to both the first pre-driver 210 and the first transistor TR1, and a leakage current of the first pre-driver 210 and a leakage current of the first transistor TR1 cannot be distinguished. However, by applying the method according to the present embodiment, only the leakage current of the first transistor TR1 can be measured. Therefore, the breakdown voltage screening test can be performed only on the first transistor TR1 without being affected by the first pre-driver 210.

In addition, the method according to the present embodiment may be implemented as an inspection method. That is, the inspection method according to the present embodiment is a method of inspecting the semiconductor circuit device 10 that includes the driver circuit 100, the pre-driver circuit 200, the first pad (pad PD1), the first wiring L1, the second pad (pad PD2), the second wiring L2, and the voltage clamp circuit 300. The driver circuit 100 includes the high-side first transistor TR1. The pre-driver circuit 200 includes the first pre-driver 210 that drives the gate of the first transistor TR1. The first wiring L1 couples the first pad (pad PD1) to the source of the first transistor TR1. The second wiring L2 couples the second pad (pad PD2) to the power supply node of the first pre-driver 210. The voltage clamp circuit 300 clamps a voltage between the power supplies of the first pre-driver 210. In addition, the inspection method according to the present embodiment includes setting the source of the first transistor TR1 to the first inspection voltage TV1 (7 V) by applying the first inspection voltage TV1 (7 V) to the first pad (pad PD1) and setting the gate of the first transistor TR1 to the second inspection voltage TV2 (0 V) different from the first inspection voltage TV1 (7 V) by applying the second inspection voltage TV2 (0 V) to the second pad (pad PD2). In addition, the inspection method according to the present embodiment includes performing the screening test for the breakdown voltage between the gate and the source of the first transistor TR1 by measuring a current flowing in the first pad (pad PD1). Therefore, it is possible to obtain effects similar to those described above.

In addition, in the semiconductor circuit device 10 according to the present embodiment, the first transistor TR1 is a P-type transistor, and the power supply node (node N1) of the first pre-driver 210 is a high-potential-side power supply node of the first pre-driver 210. Thus, it is possible to adjust the difference between the voltage on the source side of the first transistor TR1 and the voltage on the gate side of the first transistor TR1, which is a P-type transistor. Therefore, it is possible to perform the screening test for the breakdown voltage between the gate and the source of the P-type transistor.

In addition, in the semiconductor circuit device 10 according to the present embodiment, the first voltage V1 (42 V) is supplied to the source of the first transistor TR1. The first pre-driver 210 supplies the first voltage V1 (42 V) as a high-level voltage to the gate of the first transistor TR1 and supplies, as a low-level voltage, the third voltage V3 (37 V) obtained by subtracting, from the first voltage V1 (42 V), the second voltage V2 (5 V) lower than the first voltage V1 (42 V) to the gate of the first transistor TR1. Thus, the first pre-driver 210 can control to supply, to the gate of the first transistor TR1, the third voltage V3 (37 V) lower than the first voltage V1 (42 V) supplied to the source of the first transistor TR1. Therefore, it is possible to set the voltage between the gate and the source of the first transistor TR1 to a desired voltage.

In addition, in the semiconductor circuit device 10 according to the present embodiment, the breakdown voltage of the transistors included in the first pre-driver 210 is the second breakdown voltage (5 V) lower than the first breakdown voltage (6 V) that is the breakdown voltage of the first transistor TR1, and the voltage clamp circuit 300 receives a power supply voltage and protects the first pre-driver 210 by clamping the power supply voltage to a voltage equal to or lower than the voltage corresponding to the second breakdown voltage. Thus, it is possible to build the semiconductor circuit device 10 including the first pre-driver 210 including the transistors whose breakdown voltage is the second breakdown voltage lower than the first breakdown voltage and perform the breakdown voltage screening test of the first transistor TR1. Therefore, the semiconductor circuit device 10 can be made small in size and it is possible to perform the breakdown voltage screening test of the first transistor TR1.

In addition, in the inspection method according to the present embodiment, the difference (7 V) between the first inspection voltage TV1 (7 V) and the second inspection voltage TV2 (0 V) is higher than the voltage (5 V) clamped by the voltage clamp circuit 300. Therefore, it is possible to perform the breakdown voltage screening test of the first transistor TR1 using the difference in voltage that is higher than the clamped voltage.

Figure 3:
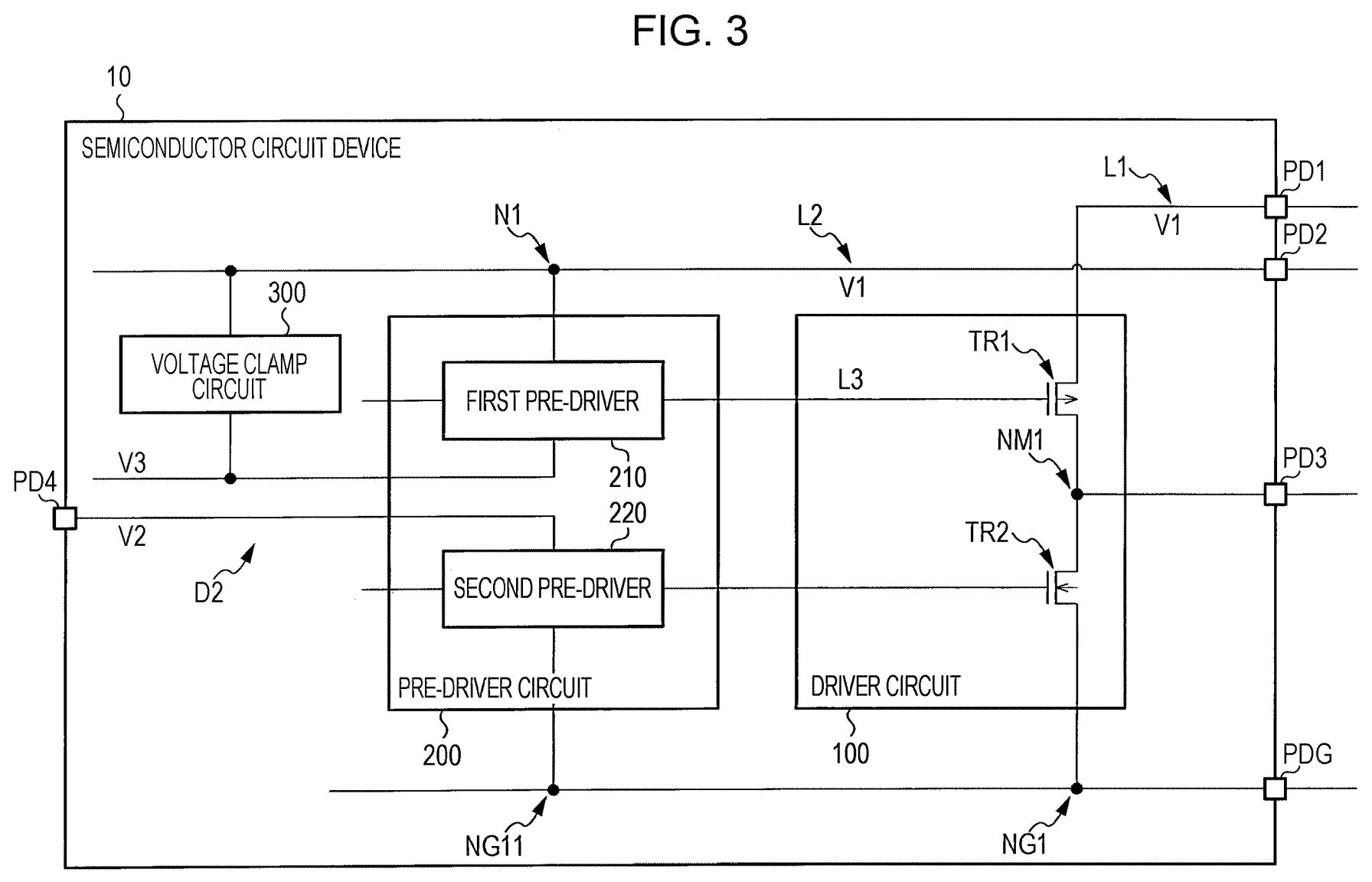

The method according to the present embodiment is not limited to the above-described method and can be modified by adding another configuration or the like. For example, FIG. 1 illustrates the example of the configuration of the semiconductor circuit device 10 including the first transistor TR1 on the high side, but as illustrated in FIG. 3, the semiconductor circuit device 10 may include a half-bridge circuit further including a second transistor TR2 on the low side. Specifically, for example, the second transistor TR2 may be included in the driver circuit 100, and a second pre-driver 220 that drives the gate of the second transistor TR2 may be included in the pre-driver circuit 200.

The second transistor TR2 is, for example, an N-type MOSFET. The source of the second transistor TR2 is coupled to the node NM1, and the drain of the second transistor TR2 is coupled to a node NG1. The drain of the first transistor TR1 is coupled to the node NM1 described above, and the source of the second transistor TR2 is coupled to the node NG1. In the normal operation, a pad PDG functions as a ground pad. That is, the node NG1 is a ground node.

The second pre-driver 220 can be implemented by an inverter circuit similar to the first pre-driver 210. One end of the second pre-driver 220 is coupled to a power supply line indicated by D2. In the normal operation, the second voltage V2 is applied to the pad PD4 from the second power supply device not illustrated. That is, the second pre-driver 220 is coupled to the power supply line for the second voltage V2. In addition, the other end of the second pre-driver 220 is coupled to a node NG11. The node NG11 is coupled to the node NG1. That is, the second pre-driver 220 is coupled to the node NG11 that is a ground node. The second pre-driver 220 outputs the second voltage V2 (5 V) as a high-level voltage and outputs a voltage of 0 V as a low-level voltage. Therefore, when the second pre-driver 220 outputs a high-level signal, the second transistor TR2 is turned on.

In a predetermined case, a protection circuit that protects the second pre-driver 220 may not be disposed between the pad PD4 and the second pre-driver 220. The predetermined case is, for example, a case where sufficient countermeasures against static electricity are taken on the second power supply device side.

When the above-described screening test of the first transistor TR1 in the semiconductor circuit device 10 illustrated in FIG. 3 is performed, the second pre-driver 220 may output a low-level signal and turn off the second transistor TR2, in addition to the above-described method. As a result, the second transistor TR2 and the node NG are insulated from each other and become a state that is equivalent to the state illustrated in FIG. 2. Alternatively, the second inspection voltage TV2 (0 V) may be applied by bringing a probe needle into contact with the pad PDG.

According to the above description, in the semiconductor circuit device 10 according to the present embodiment, the driver circuit 100 includes the second transistor TR2 on the low side, and the pre-driver circuit 200 includes the second pre-driver 220 that drives the gate of the second transistor TR2. Thus, it is possible to form the half-bridge circuit including the first transistor TR1 and the second transistor TR2 and suitably perform the breakdown voltage screening test of the first transistor TR1.

Figure 4:
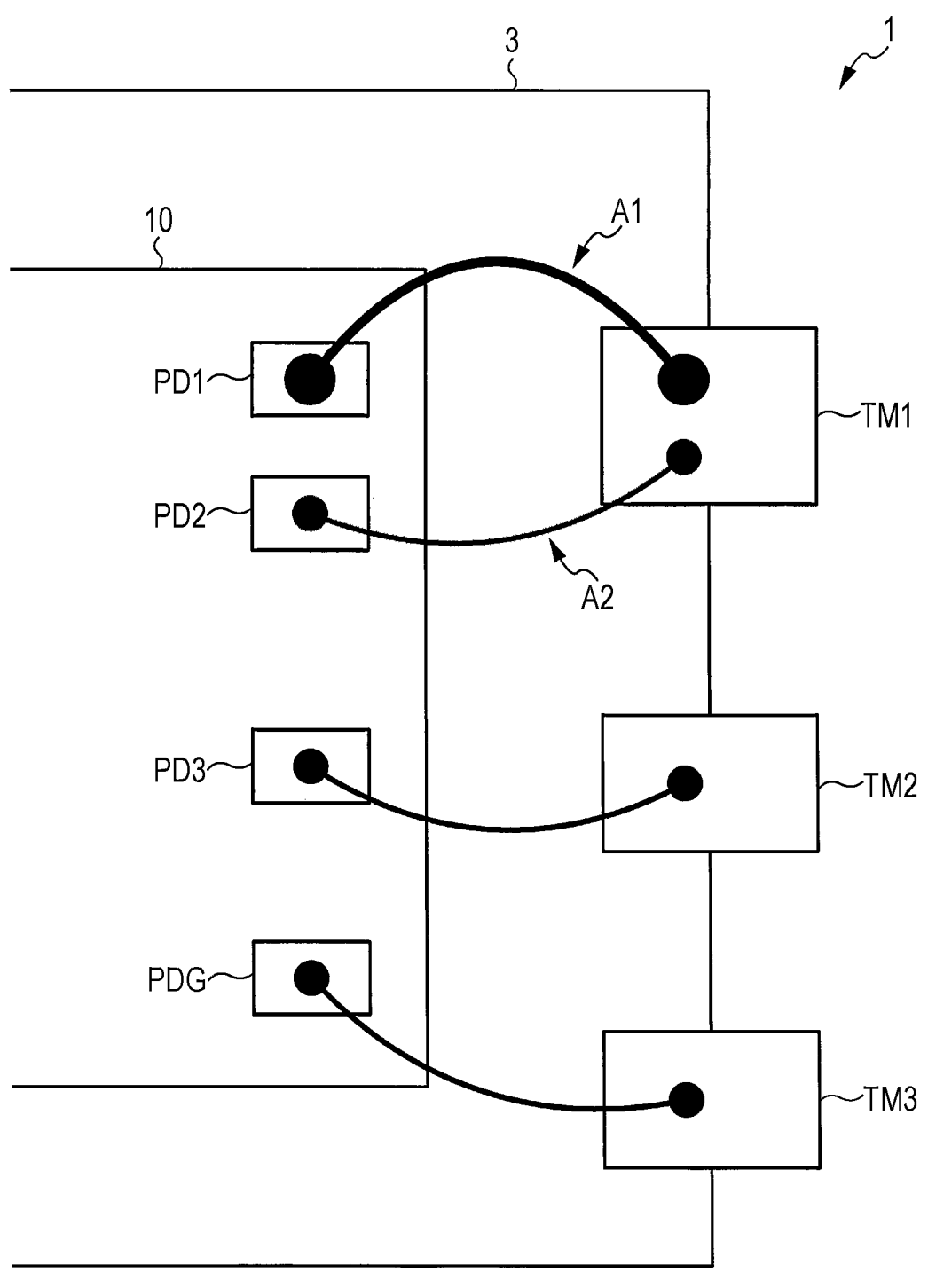
FIG. 4 is a diagram illustrating coupling of pads of the semiconductor circuit device to terminals of a package.

In addition, each of the pads included in the semiconductor circuit device 10 according to the present embodiment may be coupled to any one of external terminals of the package 3 as illustrated in FIG. 4. The coupling means that each of the pads included in the semiconductor circuit device 10 is electrically coupled to any one of the external terminals provided on the lead frame by a wire bonding process using a bonding wire. FIG. 4 only conceptually illustrates features described below, does not specifically specify the shapes of the semiconductor circuit device 10 and the package 3, and does not specifically specify the positional relationship between the pads and the external terminals. For example, in FIG. 4, the external terminals are located on the right side of the pads, but the external terminals may be located on the lower side of the pads, and the positions of the external terminals are not particularly limited.

In FIG. 4, the pad PD1 is coupled to a terminal TM1 by a bonding wire indicated by A1. The pad PD2 is coupled to the terminal TM1 by a bonding wire indicated by A2. The pad PD3 is coupled to a terminal TM2, and the pad PDG is coupled to a terminal TM3.

The terminal TM1 is coupled to the first power supply device (not illustrated) via a wiring substrate or the like. That is, the terminal TM1 functions as a power supply terminal and is disposed at a predetermined position on the wiring substrate such that the terminal TM1 is electrically coupled to the first power supply device. The terminal TM1 is mounted on the wiring substrate by using solder or the like. Similarly, the terminal TM2 is coupled to the external load M via the wiring substrate. Similarly, the terminal TM3 functions as a ground terminal and is coupled to the ground pad of the wiring substrate.

As illustrated in FIG. 4, the bonding wire indicated by A1 has a diameter larger than a diameter of the bonding wire indicated by A2. When the semiconductor circuit device 10 is used as a power device, the first transistor TR1 is turned on, and the amount of a current flowing from the pad PD1 to the external load M through the first wiring L1 and the first transistor TR1 is larger than the amount of a current flowing to the pad L2 through the second wiring PD2. However, by applying the method according to the present embodiment, the cross-sectional area of the bonding wire coupled to the pad PD1 can be large. Thus, the resistance of the bonding wire coupled to the pad PD1 can be low. Therefore, it is possible to build the semiconductor circuit device 10 based on the wiring design corresponding to the magnitude of the flowing current.

As described above, the integrated circuit device 1 according to the present embodiment includes the semiconductor circuit device 10 described above and the package 3 housing the semiconductor circuit device 10, and the power supply terminal (terminal TM1) of the package 3 is electrically coupled to the first pad (pad PD1) and the second pad (pad PD2). Therefore, it is possible to standardize the specifications of the package 3. For example, it is assumed that the method according to the present embodiment is used for an IC chip having no pad corresponding to the pad PD2 illustrated in FIG. 1 and the specifications of the IC chip are changed. In this case, for a predetermined reason, a manufacturer may need to manage both the integrated circuit device 1 accommodating the IC chip before the change in the specifications and the integrated circuit device 1 accommodating the IC chip after the change in the specifications. The predetermined reason is that the use of the integrated circuit device 1 accommodating the IC chip before the change in the specifications on the user side of the integrated circuit device 1 is continued, or the like. However, by applying the method according to the present embodiment, the manufacturer of the integrated circuit device 1 can manufacture the integrated circuit device 1 using the common package 3 for both the IC chip before the change in the specifications and the IC chip after the change in the specifications. This can reduce the burden of managing the package 3 by the manufacturer.

Although not illustrated specifically, for a reason similar to the above-described reason, the first wiring L1 may have a width different from the width of the second wiring L2. This is because, when the width of the wiring is increased, the cross-sectional area of the wiring is increased, and thus the same effects as described above can be expected. That is, in the semiconductor circuit device 10 according to the present embodiment, the width of the first wiring L1 is larger than the width of the second wiring L2. Thus, the resistance of the first wiring L1 can be lower than the resistance of the second wiring L2. Therefore, it is possible to build the semiconductor circuit device 10 based on the wiring design corresponding to the magnitude of the flowing current.

Although not illustrated specifically, the width of the first wiring L1 may be different from the width of the third wiring L3. A current flowing through the third wiring L3 is a current for driving the gate of the first transistor TR1 or a leakage current in the screening test of the first transistor TR1 for which the method according to the present embodiment is used, and the amount of a current flowing through the third wiring L3 is smaller than the amount of a current flowing through the first wiring L1 to drive the external load M. The semiconductor circuit device 10 according to the present embodiment includes the third wiring L3 coupling an output node of the first pre-driver 210 to the gate of the first transistor TR1, and the width of the first wiring L1 is larger than the width of the third wiring L3. Thus, the resistance of the first wiring L1 can be lower than the resistance of the third wiring L3. Therefore, it is possible to build the semiconductor circuit device 10 based on the wiring design corresponding to the magnitude of the current that can flow.

Figure 5:
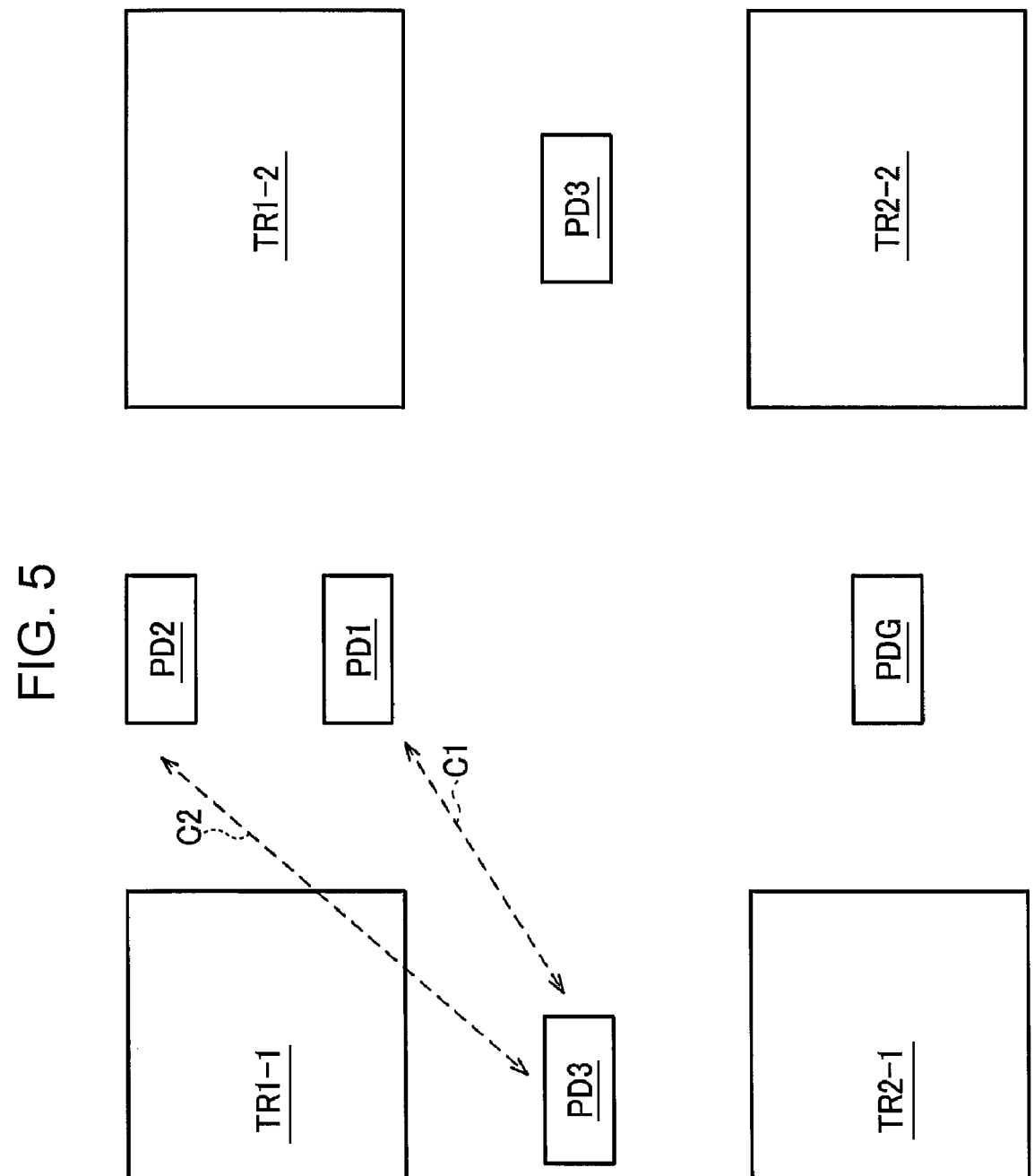
FIG. 5 is a diagram illustrating an example of a layout of an IC chip for semiconductor circuit devices.

In addition, the arrangement and the configuration of the semiconductor circuit devices 10 according to the present embodiment may be those illustrated in FIG. 5. FIG. is a plan view of an IC chip for semiconductor circuit devices 10 as viewed from above. FIG. 5 illustrates a case where two channels of the semiconductor circuit devices 10 are provided in the single IC chip. In addition, in FIG. 5, a first transistor TR1 and a second transistor TR2 in one of the semiconductor circuit devices 10 are referred to as a first transistor TR1-1 and a second transistor TR2-1, and a first transistor TR1 and a second transistor TR2 in the other of the semiconductor circuit devices 10 are referred to as a first transistor TR1-2 and a second transistor TR2-2. FIG. 5 does not illustrate components (the pre-driver circuit 200, the voltage clamp circuit 300, and the like) that are not directly related to features described below.

Since each of pads PD3 is coupled to both a first transistor TR1 and a second transistor TR2, the pads PD3 are disposed between the first transistors TR1 and the second transistors TR2 in FIG. 5. The pad PD1 and the pad PD2 are arranged such that a distance indicated by C1 is shorter than a distance indicated by C2. In other words, the semiconductor circuit device 10 according to the present embodiment includes a third pad (pad PD3) electrically coupled to the drain of the first transistor TR1, and the distance between the first pad (pad PD1) and the third pad (pad PD3) is shorter than the distance between the second pad (pad PD2) and the third pad (pad PD3). Thus, the resistance of the wiring between the first pad (pad PD1) and the third pad (pad PD3) can be low. Therefore, it is possible to build the semiconductor circuit device 10 based on the wiring design corresponding to the magnitude of the current that can flow.

Figure 6:
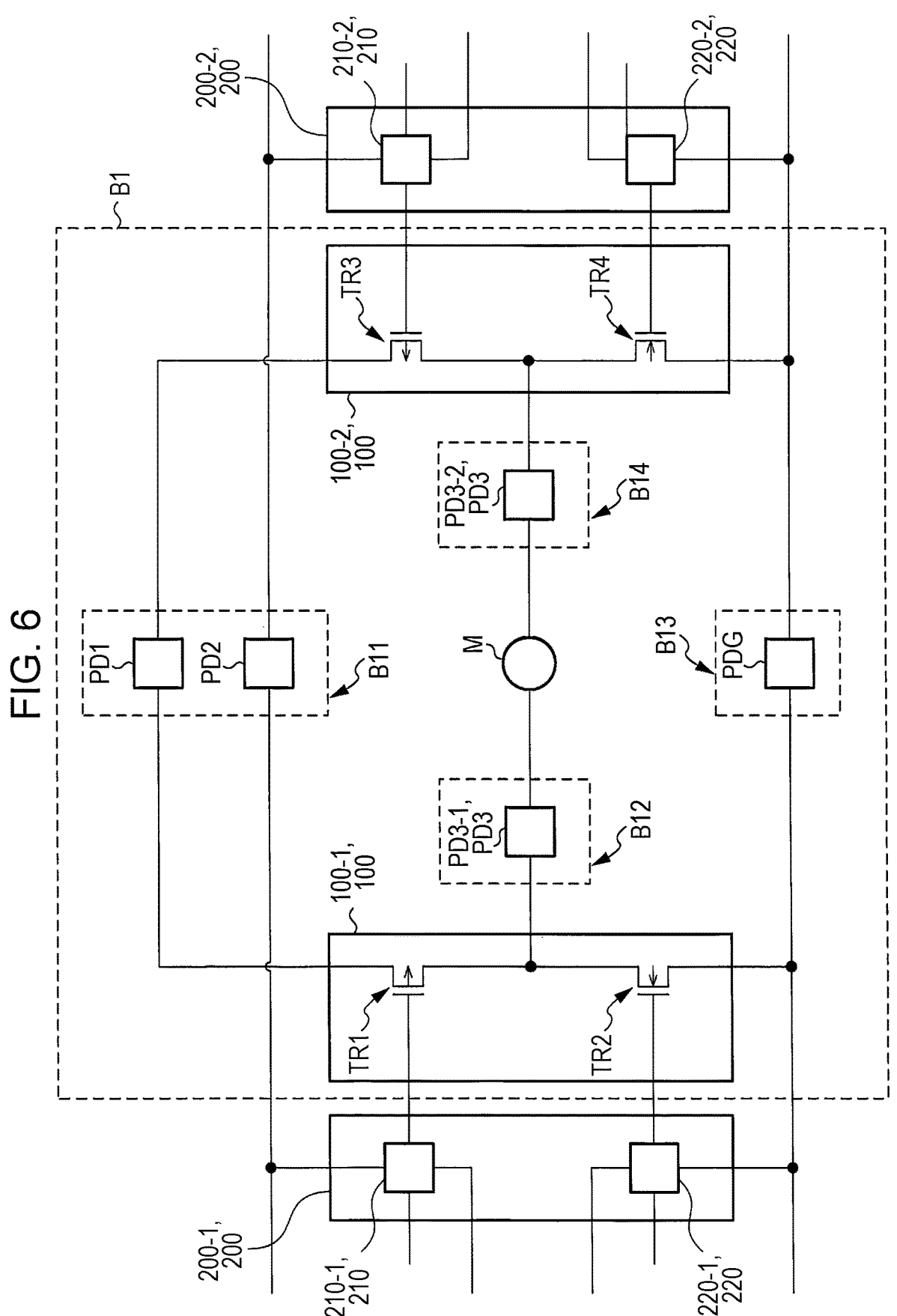
FIG. 6 is a diagram illustrating an example of an H-bridge circuit according to the embodiment.

In addition, the semiconductor circuit device 10 according to the present embodiment may form an H-bridge circuit as indicated by B1 in FIG. 6. The H-bridge circuit indicated by B1 includes driver circuits 100-1 and 100-2 and pads PD1, PD2, PD3-1, PD3-2, and PDG. The driver circuit 100-1 and the pads PD1, PD2, PD3-1, and PDG correspond to the driver circuit 100 and the pads PD1, PD2, PD3, and PDG illustrated in FIG. 3, respectively. The gate of the first transistor TR1 is driven and controlled by a first pre-driver 210-1 included in a pre-driver circuit 200-1. That is, the first pre-driver 210-1 included in the pre-driver circuit 200-1 illustrated in FIG. 6 corresponds to the first pre-driver 210 included in the pre-driver circuit 200 illustrated in FIG. 3. Similarly, the gate of the second transistor TR2 is driven and controlled by a second pre-driver 220-1 included in the pre-driver circuit 200-1. That is, the second pre-driver 220-1 included in the pre-driver circuit 200-1 illustrated in FIG. 6 corresponds to the second pre-driver 220 included in the pre-driver circuit 200 illustrated in FIG. 3.

The driver circuit 100-2 is a circuit similar to the driver circuit 100-1 and includes a third transistor TR3 and a fourth transistor TR4. The third transistor TR3 is a P-type transistor similar to the first transistor TR1 illustrated in FIG. 1 and the like, and the fourth transistor TR4 is an N-type transistor similar to the second transistor TR2 illustrated in FIG. 3. The gate of the third transistor TR3 is driven and controlled by a first pre-driver 210-2 included in a pre-driver circuit 200-2. The first pre-driver 210-2 is similar to the first pre-driver 210-1. The gate of the fourth transistor TR4 is driven and controlled by a second pre-driver 220-2 included in the pre-driver circuit 200-2. The second pre-driver 220-2 is similar to the second pre-driver 220-1.

The pad PD1 is coupled to the gate of the first transistor TR1 and the gate of the third transistor TR3. The pad PD2 is coupled to a high-potential-side power supply node of the first pre-driver 210-1 and a high-potential-side power supply node of the first pre-driver 210-2. The pad PDG is coupled to the source of the second transistor TR2 and the source of the fourth transistor TR4 and functions as a ground pad in a similar manner to the pad PDG illustrated in FIG. 3. The pad PD3-2 is coupled to the external load M in a similar manner to the pad PD3 illustrated in FIG. 3. The pad PD3-2 is coupled to the drain of the third transistor TR3 and the drain of the fourth transistor TR4.

In addition, as described above with reference to FIG. 4, the pads PD1 and PD2 indicated by a dotted-line frame B11 are coupled to the single external terminal of the package 3 by a bonding wire or the like. Similarly, the pad PD3-1 indicated by a dotted-line frame B12 is coupled to one of the external terminals of the package 3, the pad PDG indicated by a dotted-line frame B13 is coupled to one of the external terminals of the package 3, and the pad PD3-2 indicated by a dotted-line frame B14 is coupled to one of the external terminals of the package 3. That is, although the number of pads included in the H-bridge circuit indicated by B1 is five, the number of external terminals of the package 3 coupled to the pads is four.

When the H-bridge circuit described above is configured, and the external load M is, for example, a motor, the semiconductor circuit device 10 can function as a motor driver. As a control method as the motor driver, many known methods have been proposed and may be appropriately selected, and thus a detailed description thereof will be omitted.

The method according to the present embodiment can be used for the high-side first transistor TR1 even when the high-side first transistor TR1 is an N-type transistor. In addition, the method according to the present embodiment can be used for the low-side second transistor TR2. As a modification of the present embodiment, a semiconductor circuit device 10 including a first transistor TR1 that is an N-type transistor and a second transistor TR2 is described with reference to FIGS. 7, 8, and 9.

Figure 7:
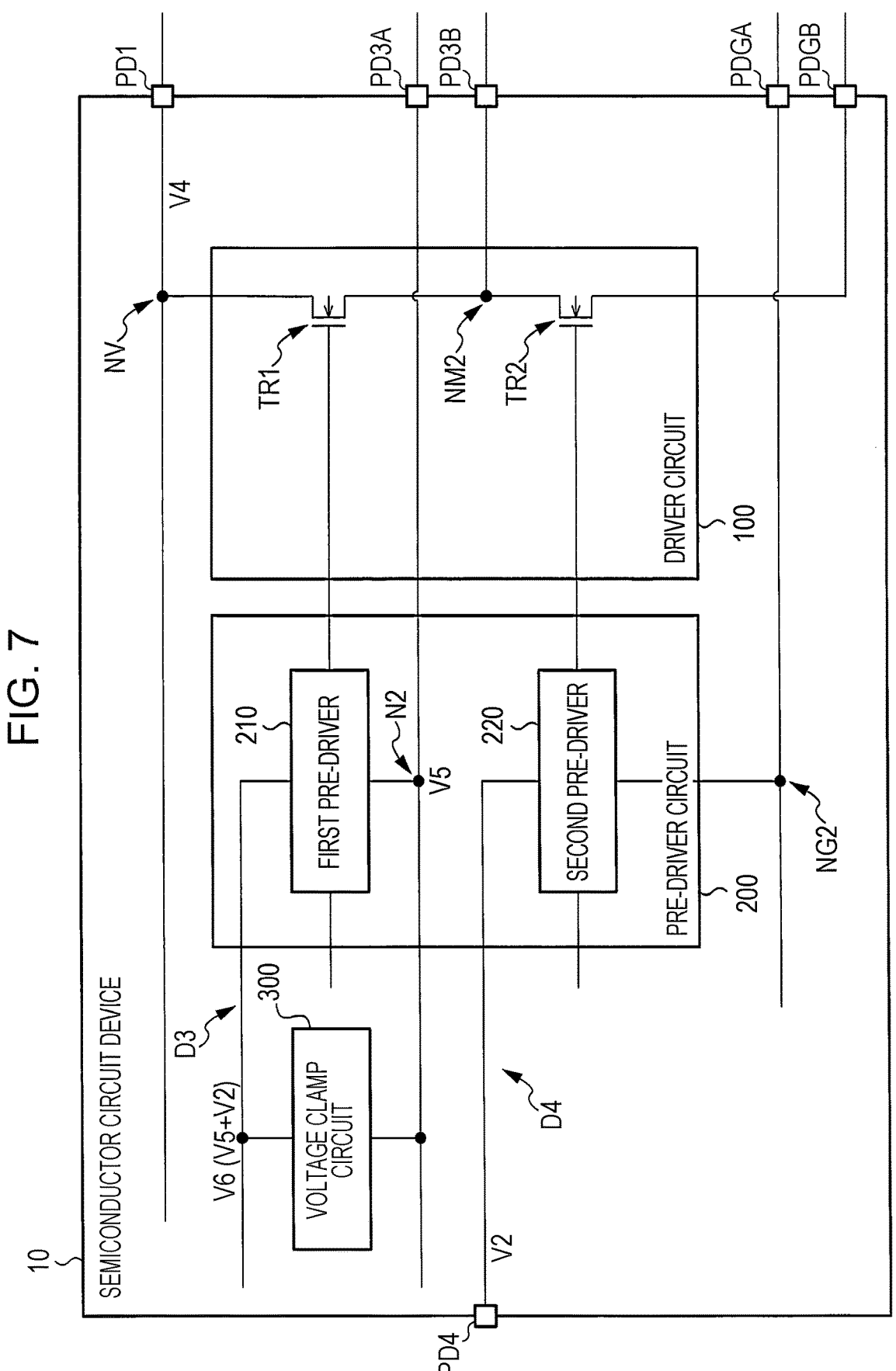
FIG. 7 is a diagram illustrating a modification of the semiconductor circuit device.

FIG. 7 is different from FIG. 3 in that a pad coupled to the external load M is divided into a pad PD3A and a pad PD3B.

In addition, FIG. 7 is different from FIG. 3 in that the single pad PD1 supplies a voltage for driving the external load M. Furthermore, FIG. 7 is different from FIG. 3 in that a pad coupled to a ground line is divided into a pad PDGA and a pad PDGB. In the modification, for convenience of description, the voltage applied to the pad PD1 illustrated in FIG. 7 is the fourth voltage V4, but the value of the fourth voltage V4 is 42 V, which is equal to the value of the first voltage V1. That is, the fourth voltage V4 illustrated in FIG. 7 is substantially equal to the first voltage V1 illustrated in FIG. 1 and the like.

In FIG. 7, the drain of the N-type first transistor TR1 is coupled to a node NV. The node NV is coupled to the pad PD1. That is, the voltage at the node NV is the fourth voltage V4 (42 V). The source of the N-type first transistor TR1 is coupled to a node NM2. The node NM2 illustrated in FIG. 7 is coupled to the external load M (not illustrated) via the pad PD3B. In FIG. 7, the first pre-driver 210 is coupled to a node N2. The node N2 is coupled to the external load M (not illustrated) via the pad PD3A. That is, when the voltage at the node N2 is a fifth voltage V5, the fifth voltage V5 is adjusted to match the voltage at the pad PD3A. Since the fifth voltage V5 is affected by the external load M, the fifth voltage V5 may not be fixed and may vary. Therefore, a specific value of the fifth voltage V5 is not indicated. The first pre-driver 210 is coupled to a power supply line indicated by D3. The power supply line indicated by D3 is a power supply line for a sixth voltage V6 as a voltage on the high-potential side of the first pre-driver 210. The sixth voltage V6 is output from a regulator (not illustrated) such that the value of the sixth voltage V6 is obtained by adding the value of the second voltage V2 (5 V) described above to the value of the fifth voltage V5. That is, the node N2 is a low-potential-side power supply node of the first pre-driver 210. In the normal operation, the first pre-driver 210 outputs the sixth voltage V6 as a high-level voltage and outputs the fifth voltage V5 as a low-level voltage.

The drain of the second transistor TR2 is coupled to the node NM2. The source of the second transistor TR2 is coupled to the pad PDGB. Similarly to FIG. 3, in the normal operation, the pad PDGB functions as a ground pad. One end of the second pre-driver 220 is coupled to a node NG2. The pad PDGA is coupled to the node NG2 and functions as a ground pad in the normal operation. That is, the one end of the second pre-driver 220 is coupled to the node NG2 as a ground node. The other end of the second pre-driver 220 is coupled to a power supply line indicated by D4, and the second voltage V2 is applied to the other terminal of the second pre-driver 220 from the pad PD4. In the normal operation, the second pre-driver 220 outputs the second voltage V2 as a high-level voltage and outputs a ground voltage (0 V) as a low-level voltage.

Figure 8:
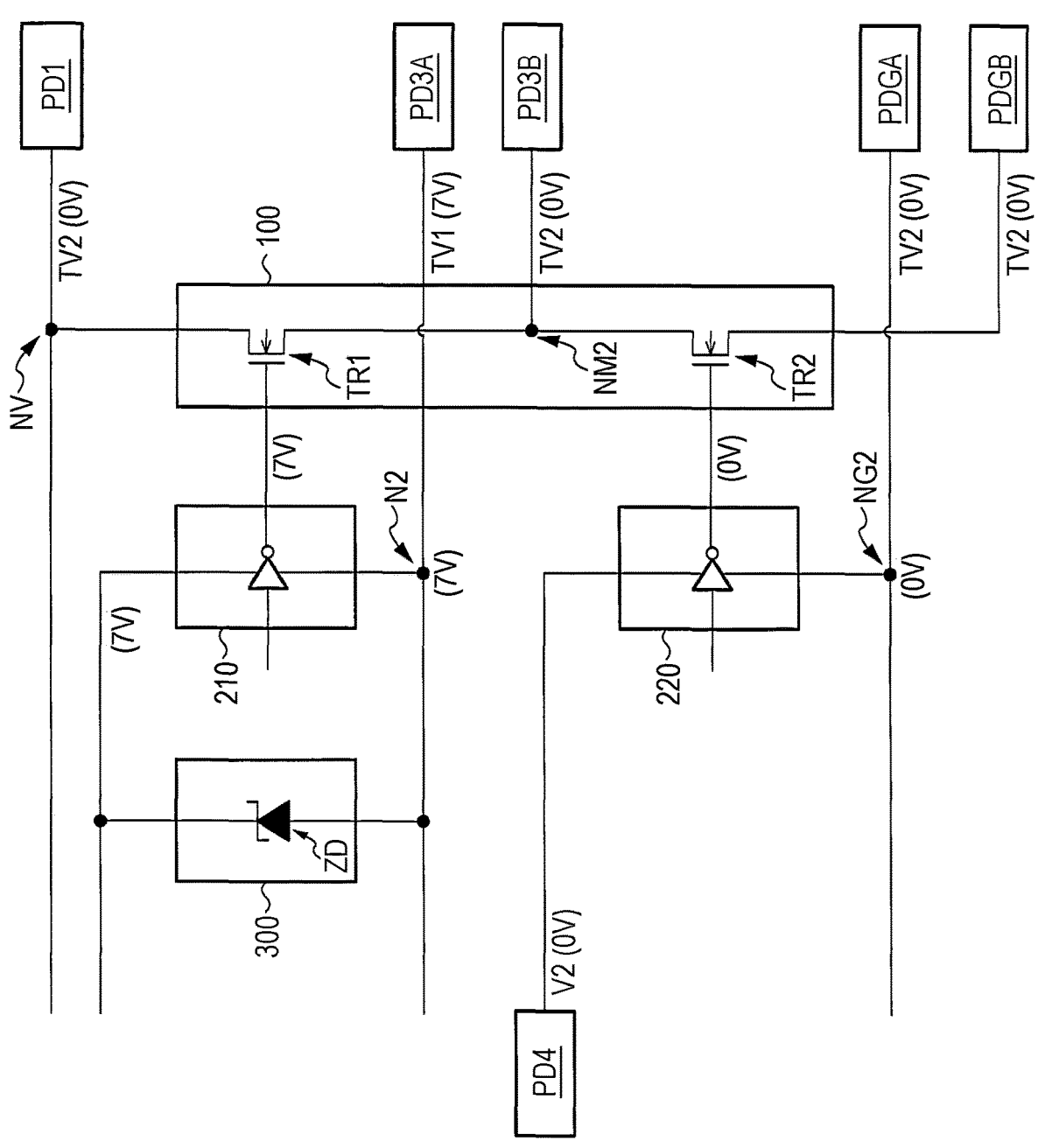
FIG. 8 is a diagram for explaining a screening test of a first transistor according to the modification.

A breakdown voltage screening test of the first transistor TR1 in the semiconductor circuit device 10 according to the modification is described with reference to FIG. 8. The first inspection voltage TV1 (7 V) is applied to the pad PD3A from the inspection device not illustrated. The second inspection voltage TV2 (0 V) is applied to the pads PD1, PD3B, PDGA, PDGB, and PD4. That is, in FIG. 8, the value of the second voltage V2 is 0 V. As a result, the second transistor TR2 is turned off.

Since the first inspection voltage TV1 (7 V) is supplied to the pad PD3A, the voltage at the node N2 is 7 V. That is, in this case, the value of the fifth voltage V5 is 7 V. Therefore, the voltage of the sixth voltage V6 described above is 7 V obtained by adding the value (0 V) of the second voltage V2 to the value (7 V) of the fifth voltage V5. Then, the voltage of 7 V is output from the first pre-driver 210, and the voltage at the gate of the first transistor TR1 becomes 7 V. Since the value of the second inspection voltage TV2 applied to the pad PD3B is 0 V, the voltage at the source of the first transistor TR1 coupled to the pad PD3B is 0 V.

Since the voltage of 7 V is applied between the gate and the source of the first transistor TR1, a leakage current flows from the gate of the first transistor TR1 toward the source of the first transistor TR1, and the value of a current flowing in the pad PD3B increases. Therefore, it is possible to perform the breakdown voltage screening test of the first transistor TR1 by measuring the value of the current flowing in the pad PD3B.

As described above, in the modification, the pad PD3B corresponds to the first pad related to the method according to the present embodiment, the pad PD3A corresponds to the second pad related to the method according to the present embodiment, wiring coupling the source of the first transistor TR1 to the pad PD3B corresponds to the first wiring L1 related to the method according to the present embodiment, and wiring coupling the pad PD3A to the node N2 corresponds to the second wiring L2 related to the method according to the present embodiment. In the semiconductor circuit device 10 according to the present embodiment, the first transistor TR1 is an N-type transistor, and the power supply node (node N2) of the first pre-driver 210 is a low-potential-side power supply node of the first pre-driver 210. Thus, while the semiconductor circuit device 10 includes the first pad and the second pad, it is possible to build the first pre-driver 210 that adjusts the difference between the voltage on the source side of the first transistor TR1 and the voltage on the gate side of the first transistor TR1, which is an N-type transistor.

In the semiconductor circuit device 10 according to the present embodiment, the fourth voltage V4 (42 V) is supplied to the drain of the first transistor TR1, and the first pre-driver 210 supplies, to the gate of the first transistor TR1, the fifth voltage V5 that is a voltage at the source of the first transistor TR1 as a low-level voltage. The first pre-driver 210 supplies, to the gate of the first transistor TR1, the sixth voltage V6 as a high-level voltage. The sixth voltage V6 is obtained by adding the fifth voltage V5 to the second voltage V2 (5 V) lower than the fourth voltage V4 (42 V). Therefore, it is possible to build the first pre-driver 210 that controls turning on and off of the gate of the first transistor TR1 with a voltage equal to or lower than the second breakdown voltage based on the fifth voltage V5 and the sixth voltage V6.

Figure 9:
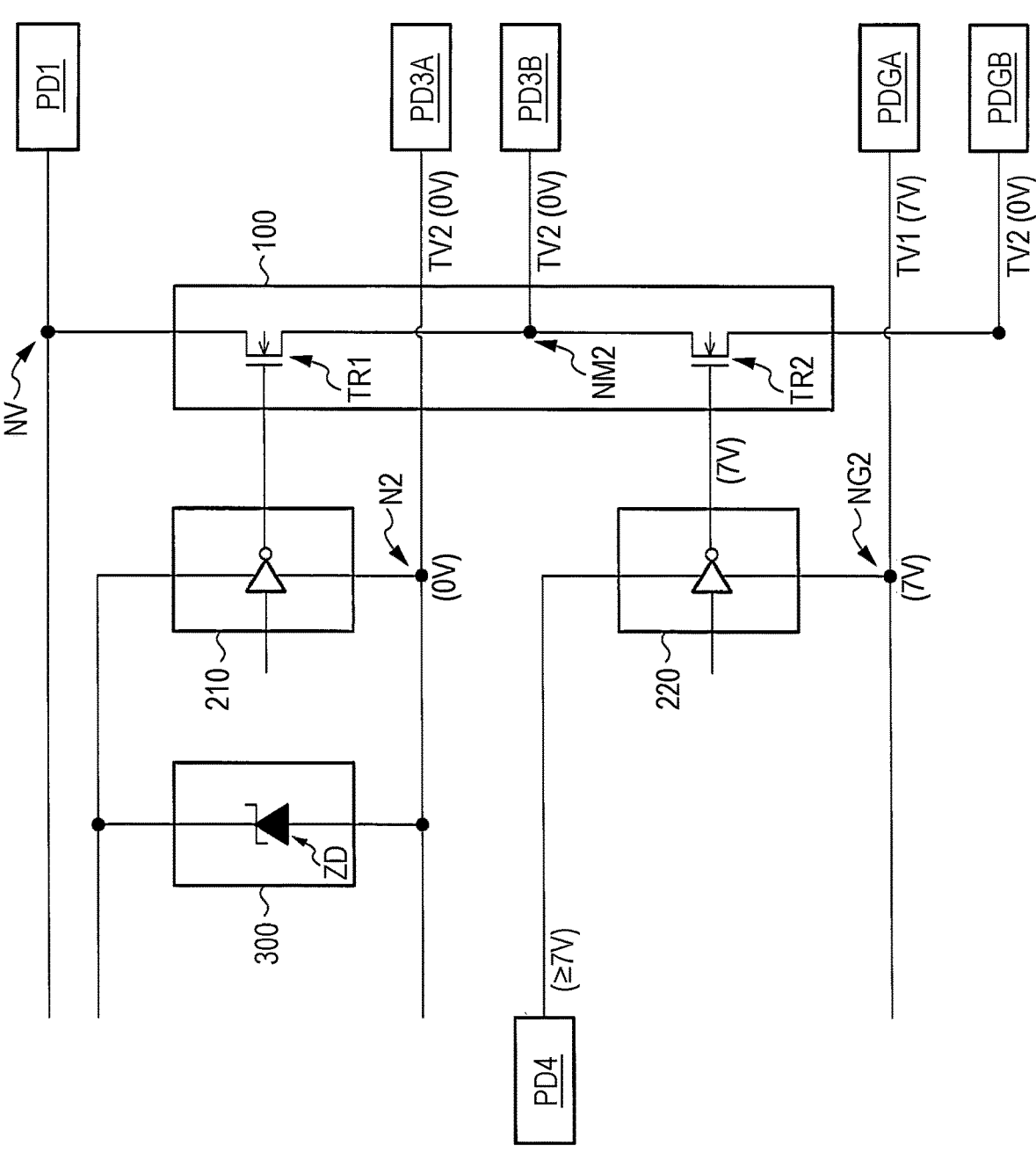
FIG. 9 is a diagram for explaining a screening test of a second transistor according to the modification.

A breakdown voltage screening test of the second transistor TR2 in the semiconductor circuit device 10 according to the modification is described with reference to FIG. 9. The first inspection voltage TV1 (7 V) is applied to the pad PDGA from the inspection device not illustrated. The second inspection voltage TV2 (0 V) is applied to the pads PD3A, PD3B, and PDGB. The first inspection voltage TV1 (7 V) or a voltage higher than the first inspection voltage TV1 (7 V) is applied to the pad PD4 from the inspection device not illustrated. Then, a control signal with a shifted level is input to the second pre-driver 220 from the control circuit not illustrated, the second pre-driver 220 outputs a voltage of 7 V as a low-level voltage, and the voltage at the gate of the second transistor TR2 becomes 7 V. As a result, since the source of the second transistor TR2 is coupled to the pad PDGB, the voltage at the source of the second transistor TR2 is 0 V, and the voltage of 7 V is applied between the gate and the source of the second transistor TR2. Thus, a leakage current flows from the gate of the second transistor TR2 toward the source of the second transistor TR2, and the value of a current flowing in the pad PDGB increases. Therefore, it is possible to perform the breakdown voltage screening test of the second transistor TR2 by measuring the value of a current flowing in the pad PDGB. When the high-side first transistor TR1 can be turned off, the magnitude of the voltage to be applied to the pad PD1 is not particularly limited.

In the breakdown voltage screening test of the second transistor TR2, the semiconductor circuit device 10 may have the configuration illustrated in FIG. 3, and the first inspection voltage TV1 (7 V) can be directly applied to the gate of the second transistor TR2 based on a setting in the second power supply device not illustrated. In this case, a leakage current or the like occurs due to the transistors included in the second pre-driver 220 or the like, and it is not possible to accurately measure the value of the leakage current that occurs from the second transistor TR2. However, a leakage current can occur due to only the second transistor TR2 by applying the method described with reference to FIG. 9, and thus it is possible to improve the reliability of the breakdown voltage screening test of the second transistor TR2. In addition, it is possible to expect similar effects to those described above in the breakdown voltage screening test of the first transistor TR1 described above.

Figure 10:
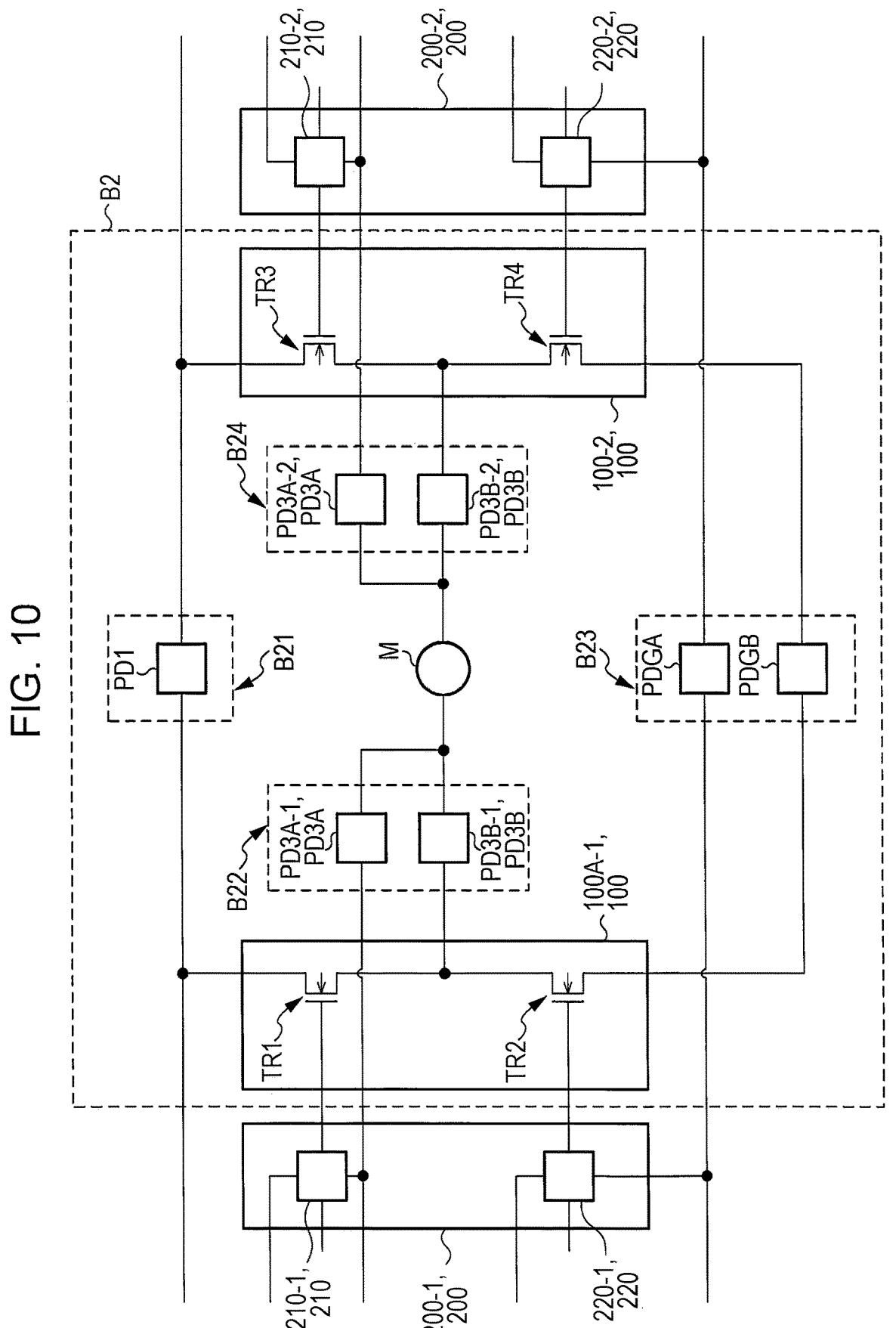
FIG. 10 is a diagram illustrating an example of a H-bridge circuit according to the modification.

The semiconductor circuit device 10 according to the modification can form an H-bridge circuit indicated by B2 in FIG. 10. The H-bridge circuit indicated by B2 includes driver circuits 100-1 and 100-2 and pads PD1, PD3A-1, PD3B-1, PDGA-1, PDGB-1, PD3A-2, PD3B-2, PDGA-2, and PDGB-2. The driver circuit 100-1 and the pads PD1, PD3A-1, PD3B-1, PDGA-1, and PDGB-1 correspond to the driver circuit 100 and the pads PD1, PD3A, PD3B, PDGA, and PDGB illustrated in FIG. 7, respectively. The gate of the first transistor TR1 is driven and controlled by the first pre-driver 210-1 included in the pre-driver circuit 200-1. The first pre-driver 210-1 included in the pre-driver circuit 200-1 illustrated in FIG. 10 corresponds to the first pre-driver 210 included in the pre-driver circuit 200 illustrated in FIG. 7. Similarly, the second pre-driver 220-1 included in the pre-driver circuit 200-1 illustrated in FIG. 10 corresponds to the second pre-driver 220 included in the pre-driver circuit 200 illustrated in FIG. 7.

The driver circuit 100-2 illustrated in FIG. 10 is a circuit similar to the driver circuit 100-1. The third transistor TR3 illustrated in FIG. 10 is an N-type transistor similar to the first transistor TR1 illustrated in FIG. 7 and the like, and the fourth transistor TR4 is an N-type transistor similar to the second transistor TR2 illustrated in FIG. 7. The first pre-driver 210-2 and the second pre-driver 220-2 included in the pre-driver circuit 200-2 are similar to the first pre-driver 210 and the second pre-driver 220 described with reference to FIG. 7, and will not be described.

The pad PD1 is coupled to the gate of the first transistor TR1 and the gate of the third transistor TR3. The pad PD3A-1 that is coupled to a low-potential-side power supply node of the first pre-driver 210-1 is coupled to a node coupling the pad PD3B-1 to an external power supply. Similarly, the pad PD3A-2 that is coupled to a low-potential-side power supply node of the first pre-driver 210-2 is coupled to a node coupling the pad PD3B-2 to the external power supply. The pad PDGA is coupled to a ground node coupled to the second pre-drivers 220-1 and 220-2. The pad PDGB is coupled to the source of the second transistor TR2 and the source of the fourth transistor TR4.

The pad PD1 indicated by a dotted-line frame B21 is coupled to one of the external terminals of the package 3 by a bonding wire or the like. The pads PD3A-1 and PD3B-1 indicated by a dotted-line frame B22 are coupled to one of the external terminals of the package 3. That is, as described above, the pads PD3A-1 and PD3B-1 are coupled to the same external terminal by wire bonding or the like. Similarly, the pads PDGA and PDGB indicated by a dotted-line frame B23 are coupled to one of the external terminals of the package 3. Similarly, the pads PD3A-2 and PD3B-2 indicated by a dotted-line frame B24 are coupled to one of the external terminals of the package 3. That is, in the modification, although the number of pads included in the H-bridge circuit indicated by B2 is seven, the number of external terminals of the package 3 coupled to the pads is four.

As described above, according to an aspect of the present disclosure, a semiconductor circuit device includes a driver circuit, a pre-driver circuit, a first pad, first wiring, a second pad, second wiring, and a voltage clamp circuit. The driver circuit includes a high-side first transistor. The pre-driver circuit includes a first pre-driver that drives a gate of the first transistor. The first wiring couples the first pad to a source of the first transistor. The second wiring couples the second pad to a power supply node of the first pre-driver. The voltage clamp circuit clamps a voltage between power supplies of the first pre-driver.

In this case, a voltage output from the first pre-driver to the gate of the first transistor can be different from a voltage supplied to the gate of the first transistor. Thus, when the same voltage is supplied to the first wiring and the second wiring, a difference between a voltage at the source of the first transistor and a voltage at the gate of the first transistor can be set to a desired value. Therefore, it is possible to perform a breakdown voltage screening test of the first transistor.

The first wiring may have a width larger than a width of the second wiring.

In this case, the resistance of the first wiring can be lower than the resistance of the second wiring.

The semiconductor circuit device may include third wiring coupling an output node of the first pre-driver to the gate of the first transistor, and the first wiring may have a width larger than a width of the third wiring.

In this case, the resistance of the first wiring can be lower than the resistance of the third wiring.

A breakdown voltage of a transistor included in the first pre-driver may be a second breakdown voltage lower than a first breakdown voltage that is a breakdown voltage of the first transistor, and the voltage clamp circuit may receive a power supply voltage and protect the first pre-driver by clamping the power supply voltage to a voltage equal to or lower than a voltage corresponding to the second breakdown voltage.

In this case, it is possible to build the semiconductor circuit device including the first pre-driver having the transistor whose breakdown voltage is the second breakdown voltage lower than the first breakdown voltage, and perform the breakdown voltage screening test of the first transistor.

The first transistor may be a P-type transistor, and the power supply node of the first pre-driver may be a high-potential-side power supply node of the first pre-driver.

In this case, it is possible to adjust a difference between a voltage on the source side of the first transistor and a voltage on the gate side of the first transistor, which is a P-type transistor.

A first voltage may be supplied to the source of the first transistor, the first pre-driver may supply the first voltage as a high-level voltage to the gate of the first transistor, and supply, as a low-level voltage, a third voltage obtained by subtracting, from the first voltage, a second voltage lower than the first voltage to the gate of the first transistor.

In this case, the first pre-driver can control to supply, to the gate of the first transistor, the third voltage lower than the first voltage supplied to the source of the first transistor.

The first transistor may be an N-type transistor, and the power supply node of the first pre-driver may be a low-potential-side power supply node of the first pre-driver.

In this case, while the semiconductor circuit device includes the first pad and the second pad, it is possible to build the first pre-driver that adjusts the difference between the voltage on the source side of the first transistor and the voltage on the gate side of the first transistor, which is an N-type transistor.

A fourth voltage may be supplied to a drain of the first transistor, and the first pre-driver may supply, as a low-level voltage, a fifth voltage that is a voltage at the source of the first transistor to the gate of the first transistor. The first pre-driver may supply, as a high-level voltage, a sixth voltage obtained by adding the fifth voltage to the second voltage lower than the fourth voltage to the gate of the first transistor.

In this case, it is possible to build the first pre-driver that controls turning on and off of the gate of the first transistor with a voltage equal to or lower than the second breakdown voltage based on the fifth voltage and the sixth voltage.

The driver circuit may include a low-side second transistor, and the pre-driver circuit may include a second pre-driver that drives a gate of the second transistor.

In this case, it is possible to configure a half-bridge circuit including the first transistor and the second transistor, and suitably perform the breakdown voltage screening test of the first transistor.

The semiconductor circuit device may include a third pad electrically coupled to a drain of the first transistor, and a distance between the first pad and the third pad may be shorter than a distance between the second pad and the third pad.

In this case, the resistance of wiring between the first pad and the third pad can be low.

According to another aspect of the present disclosure, an integrated circuit device includes the semiconductor circuit device described above, and a package housing the semiconductor circuit device, and a power supply terminal of the package is electrically coupled to the first pad and the second pad.

According to still another aspect of the present disclosure, an inspection method is a method of inspecting a semiconductor circuit device including a driver circuit, a pre-driver circuit, a first pad, first wiring, a second pad, second wiring, and a voltage clamp circuit. The driver circuit includes a high-side first transistor. The pre-driver circuit includes a first pre-driver that drives a gate of the first transistor. The first wiring couples the first pad to a source of the first transistor. The second wiring couples the second pad to a power supply node of the first pre-driver. The voltage clamp circuit clamps a voltage between power supplies of the first pre-driver. The inspection method includes setting the source of the first transistor to a first inspection voltage by applying the first inspection voltage to the first pad, and setting the gate of the first transistor to a second inspection voltage different from the first inspection voltage by applying the second inspection voltage to the second pad. In addition, the inspection method includes performing a screening test for a breakdown voltage between the gate and the source of the first transistor by measuring a current flowing in the first pad.

A difference between the first inspection voltage and the second inspection voltage may be higher than the voltage clamped by the voltage clamp circuit.

In this case, it is possible to perform the breakdown voltage screening test of the first transistor using the difference in voltage that is higher than the clamped voltage.

Although the present embodiment is described above, those skilled in the art will readily appreciate that many modifications can be made without materially departing from the features and effects of the present disclosure. Therefore, all such modifications are included in the scope of the present disclosure. For example, a term described together with a different term having a broader meaning or the same meaning at least once in the specification or the drawings can be replaced with the different term in any place in the specification or the drawings. In addition, all combinations of the embodiment and the modifications are also included in the scope of the present disclosure. The configurations, operations, and the like in the semiconductor circuit device, the integrated circuit device, the inspection method, and the like are not limited to those described in the present embodiment and can be variously modified.

What is claimed is:

1. A semiconductor circuit device comprising:
   a driver circuit including a first transistor on a high side;
   a pre-driver circuit including a first pre-driver that drives a gate of the first transistor;
   a first pad;
   first wiring coupling the first pad to a source of the first transistor;
   a second pad;
   second wiring coupling the second pad to a power supply node of the first pre-driver; and
   a voltage clamp circuit that clamps a voltage between power supplies of the first pre-driver.

2. The semiconductor circuit device according to claim 1, wherein
   the first wiring has a width larger than a width of the second wiring.

3. The semiconductor circuit device according to claim 1, further comprising:
   third wiring coupling an output node of the first pre-driver to the gate of the first transistor, wherein
   the first wiring has a width larger than a width of the third wiring.

4. The semiconductor circuit device according to claim 1, wherein
   a breakdown voltage of a transistor included in the first pre-driver is a second breakdown voltage lower than a first breakdown voltage that is a breakdown voltage of the first transistor, and
   the voltage clamp circuit receives a power supply voltage and protects the first pre-driver by clamping the power supply voltage to a voltage equal to or less than a voltage corresponding to the second breakdown voltage.

5. The semiconductor circuit device according to claim 1, wherein
   the first transistor is a P-type transistor, and
   the power supply node of the first pre-driver is a high-potential-side power supply node of the first pre-driver.

6. The semiconductor circuit device according to claim 5, wherein a first voltage is supplied to the source of the first transistor, and the first pre-driver supplies the first voltage as a high-level voltage to the gate of the first transistor and supplies, as a low-level voltage, a third voltage obtained a third voltage obtained by subtracting a second voltage lower than the first voltage to the gate of the first transistor from the first voltage.

7. The semiconductor circuit device according to claim 1, wherein the first transistor is an N-type transistor, and the power supply node of the first pre-driver is a low-potential-side power supply node of the first pre-driver.

8. The semiconductor circuit device according to claim 7, wherein a fourth voltage is supplied to a drain of the first transistor, the first pre-driver supplies, as a low-level voltage, a fifth voltage that is a voltage at the source of the first transistor to the gate of the first transistor, and the first pre-driver supplies, as a high-level voltage, a sixth voltage obtained by adding the fifth voltage to a second voltage lower than the fourth voltage to the gate of the first transistor.

9. The semiconductor circuit device according to claim 1, wherein the driver circuit includes a second transistor on a low side, and the pre-driver circuit includes a second pre-driver circuit that drives a gate of the second transistor.

10. The semiconductor circuit device according to claim 1, further comprising a third pad electrically coupled to a drain of the first transistor, wherein a distance between the first pad and the third pad is shorter than a distance between the second pad and the third pad.

11. An integrated circuit device comprising:

the semiconductor circuit device according to claim 1; and a package housing the semiconductor circuit device, wherein a power supply terminal of the package is electrically coupled to the first pad and the second pad.

12. A method of inspecting a semiconductor circuit device including a driver circuit including a first transistor on a high side, a pre-driver circuit including a first pre-driver that drives a gate of the first transistor, a first pad, first wiring coupling the first pad to a source of the first transistor, a second pad, second wiring coupling the second pad to a power supply node of the first pre-driver, and a voltage clamp circuit that clamps a voltage between power supplies of the first pre-driver, the method comprising:

setting the source of the first transistor to a first inspection voltage by applying the first inspection voltage to the first pad;

setting the gate of the first transistor to a second inspection voltage different from the first inspection voltage by applying the second inspection voltage to the second pad; and performing a screening test for a breakdown voltage between the gate and the source of the first transistor by measuring a current flowing in the first pad.

13. The method of inspecting the semiconductor circuit device according to claim 12, wherein a difference between the first inspection voltage and the second inspection voltage is higher than the voltage clamped by the voltage clamp circuit.

\* \* \* \* \*